United States Patent
Saeki et al.

(10) Patent No.: US 6,875,519 B2
(45) Date of Patent: Apr. 5, 2005

(54) TWO-LAYER COPPER POLYIMIDE SUBSTRATE

(75) Inventors: Noriyuki Saeki, Niihama (JP); Takefumi Sakou, Niihama (JP); Hiroto Watanabe, Ichikawa (JP); Yoshiro Ishii, Ichikawa (JP)

(73) Assignee: Sumitomo Metal Mining Co., Ltd., Tokyo (JP)

( * ) Notice: Subject to any disclaimer, the term of this patent is extended or adjusted under 35 U.S.C. 154(b) by 0 days.

(21) Appl. No.: 10/443,145

(22) Filed: May 22, 2003

(65) Prior Publication Data

US 2003/0224187 A1 Dec. 4, 2003

(30) Foreign Application Priority Data

May 23, 2002 (JP) .......................... 2002-149595

(51) Int. Cl.$^7$ ............................. B32B 9/04; C25D 5/16; C23C 28/02
(52) U.S. Cl. ...................... 428/473.5; 205/95; 205/187
(58) Field of Search .................... 428/473.5; 205/95, 205/183, 184, 187

(56) References Cited

U.S. PATENT DOCUMENTS

| | | | | |
|---|---|---|---|---|
| 5,667,851 A | * | 9/1997 | Edman et al. | 205/95 |
| 6,042,929 A | * | 3/2000 | Burke et al. | 428/141 |
| 6,045,713 A | * | 4/2000 | Tamiya et al. | 216/13 |

* cited by examiner

Primary Examiner—James J. Seidleck
Assistant Examiner—Thao Tran
(74) Attorney, Agent, or Firm—Dykema Gossett PLLC

(57) ABSTRACT

A two-layer copper polyimide substrate includes a modified layer on the surface of a polyimide film having a thickness of not more than 200 Å, and preferably not less than 50 Å, as evaluated by a method by dyeing a section thereof with a silver nitrate aqueous solution and observing it by a transmission electron microscope (TEM). A metal seed layer is formed on the polyimide film surface, followed by forming a copper layer thereon by copper electroplating or copper electroless plating or a combination of the both, providing a two-layer copper polyimide substrate in which any of an initial adhesion, a heat resistant adhesion after standing in air at 150° C. for 168 hours, and a PCT adhesion after PCT test at 121° C. and at a humidity of 95% under 2 atmospheres for 100 hours are 400 N/m or more.

5 Claims, 10 Drawing Sheets

FIG.1 ANALYSIS RESULT OF PEEL POSITION ACCORDING TO SAM OF SPECIES BEFORE AND AFTER HEAT RESISTANCE TEST (MODIFIED LAYER THICKNESS 50 Å)

RELATION BETWEEN MODIFIED LAYER THICKNESS
AND INITIAL ADHESION

RELATION BETWEEN MODIFIED LAYER THICKNESS
AND HEAT RESISTANT ADHESION

TWO-LAYER COPPER POLYIMIDE SUBSTRATE

BACKGROUND OF THE INVENTION

1. Field of the Invention

The present invention relates to a two-layer copper polyimide substrate that is a material of electronic parts such as printed wiring boards, flexible printed circuits, TAB tapes, and COF tapes.

2. Description of the Prior Art

Polyimides have excellent heat resistance and are by no means inferior to other plastic materials with respect to mechanical, electrical and chemical characteristics, and therefore, are widely used as insulating substrate materials for electronic parts such as printed wiring boards (PWB), flexible printed circuits (FPC), tapes for tape automated bonding (TAB), and chip on films (COF). Such PWB, FPC, TAB or COF is obtained by processing a metal-coated substrate comprising a film, at least one surface of which is coated mainly with copper as a metallic conductive layer.

Metal-coated substrates include three-layer copper polyimide substrates comprising a polyimide film and a metal foil welded to each other via an adhesive and two-layer copper polyimide substrates comprising a polyimide film having a metal layer directly formed thereon. Further, two-layer copper polyimide substrates include casting substrates prepared by subjecting a commercially available copper foil to film formation and two-layer copper polyimide substrates prepared by plating comprising directly laminating a metal on a commercially available polyimide film by sputtering and electroplating or electroless plating or a combination of the both.

In recent years, especially, following miniaturization or thinning of portable electronic instruments, the foregoing TAB and COF are also required to realize miniaturization or thinning, i.e., high density, and their wiring pitches (wiring width/space width) are becoming narrow more and more. Therefore, two-layer copper polyimide substrates capable of making the thickness of a conductive layer (copper coat) thin and freely controlling it are watched.

However, though the two-layer copper polyimide substrates have an initial adhesion at a practically useful level, they are low in adhesions related to reliability, such as an adhesion in a heat resistant environment and an adhesion in a high-temperature and high-humidity environment, as compared with conventional three-layer copper polyimide substrates, and bring about uneasiness. Accordingly, the market requires the two-layer copper polyimide substrates to ensure a comparable adhesion (about 400 N/m) to three-layer copper polyimide substrates.

SUMMARY OF THE INVENTION

Accordingly, an object of the invention is to provide a two-layer copper polyimide substrate in which any of an initial adhesion, a heat resistant adhesion after standing in air at 150° C. for 168 hours, and a PCT adhesion after PCT (Pressure Cooker Test) test at 121° C. and at a humidity of 95% under 2 atmospheres for 100 hours are 400 N/m or more.

For solving the foregoing problems, the two-layer copper polyimide substrate according to the invention comprises at least a polyimide film, a metal seed layer formed directly on the polyimide film, and a copper layer formed on the metal seed layer, wherein in the case where the surface of the polyimide film contacting with the metal seed layer is modified so as to have a thickness of not more than 200 Å as evaluated by the silver nitrate dyeing method, thereby plating the copper layer on the polyimide film, any of an initial adhesion, a heat resistant adhesion after standing in air at 150° C. for 168 hours, and a PCT adhesion after PCT test at 121° C. and at a humidity of 95% under 2 atmospheres for 100 hours are 400 N/m or more in a thickness of the conductive layer of copper of 8 μm.

Further, in the invention, the metal constituting the metal seed layer comprises nickel, chromium, or an alloy thereof; and the polyimide film is one containing pyromelltic acid dianhydride (PMDA) and 4,4'-diaminodiphenyl ether (ODA) as major components, or one containing a component comprising containing pyromelltic acid dianhydride (PMDA) and 4,4'-diaminodiphenyl ether (ODA) and a component comprising biphenyltetracarboxylic acid dianhydride (BPDA) and 4,4'-diaminodiphenyl ether (ODA) as major components.

In addition, in the invention, it is preferred that the, modified layer present in the surface side of the polyimide film has a thickness of not less than 50 Å as evaluated by the silver nitrate dyeing method.

In addition, the invention is characterized in that modification of the polyimide film surface is carried out by plasma treatment, corona discharge, or wet treatment.

Specifically, the invention has found that in a two-layer copper polyimide substrate, by employing a structure such that a modified layer on the surface of a polyimide film has a thickness of not more than 200 Å, and preferably not less than 50 Å as evaluated by a method dyeing a section thereof with a silver nitrate aqueous solution and observing it by a transmission electron microscope (TEM) and that d metal seed layer comprising nickel, chromium or an alloy thereof is formed on the polyimide film surface, followed by forming a copper layer thereon by copper electroplating or copper electroless plating or a combination of the both, it is possible to provide a two-layer copper polyimide substrate in which any of an initial adhesion, a heat resistant adhesion after standing in air at 150° C. for 168 hours, and a PCT adhesion after PCT test at 121° C. and at a humidity of 95% under 2 atmospheres for 100 hours are 400 N/m or more.

Further, in the invention, a polyimide film is one containing pyromelltic acid dianhydride (PMDA) and 4,4'-diaminodiphenyl ether (ODA) as major components, or one containing a component comprising containing pyromelltic acid dianhydride (PMDA) and 4,4'-diaminodiphenyl ether (ODA) and a component comprising biphenyltetracarboxylic acid dianhydride (BPDA) and 4,4'-diaminodiphenyl ether (ODA) as major components, and the invention comprises a two-layer copper polyimide substrate having the foregoing structure.

DETAILED DESCRIPTION OF THE INVENTION

Figure 1:
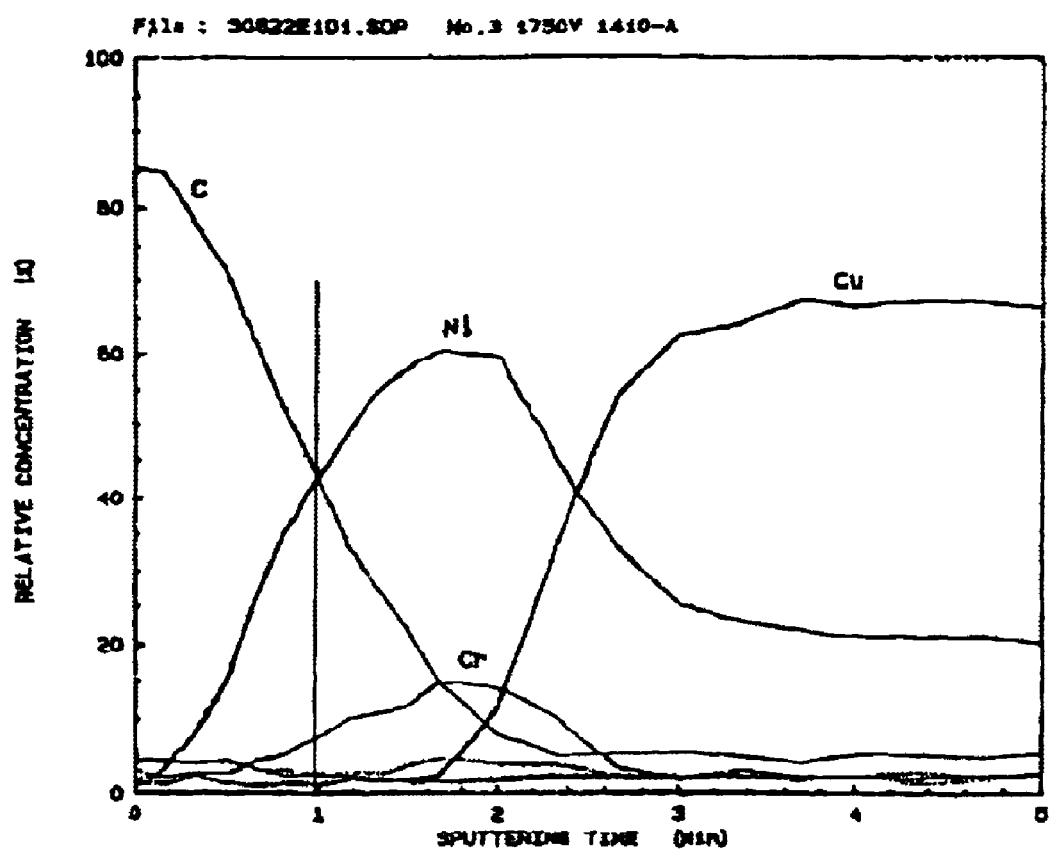
FIG. 1 shows the results of the scanning auger electron (SAM) analysis before heat test in the case of the modified layer thickness of 300 Å according to Example 1.

The present inventors have made detailed examinations on changes in adhesion characteristics of two-layer copper polyimide substrates and found that a reduction in adhesion after heat test and PCT test is caused by the modification state of a polyimide film at the interface with a metal seed layer. Further, they have found that the foregoing problems can be solved by quantitatively defining its thickness, leading to accomplishment of the invention.

It is known that when the polyimide, film surface is subjected to modification treatment such as plasma or corona discharge or a wet treatment, hydrophilic functional groups such as a carboxyl group and a hydroxyl group is introduced on the surface, whereby adhesion to a metal is enhanced. However, as a result of detailed analysis of the, peeled interface of a specimen of a sample whose adhesion has lowered after the heat test or PCT test, it has become clear that oxidation of the metal seed layer or brittleness of the surface occurs due to a modified layer formed by these treatments, causing a reduction in adhesion.

Then, the present inventors have made extensive and intensive investigations while paying attention to the matter that for ensuring all of the initial adhesion, the heat resistant adhesion and the PCT adhesion with a good balance, it is necessary to control the structure of the modified layer of the polyimide film at the interface between the polyimide film and the metal seed layer. In progressing the investigations, the inventors attached importance to necessity for quantitatively evaluating the modified layer, and the present assignee filed an application for patent on May 17, 2002 as Japanese Patent Application No 2002-143722. This application discloses that a section of a polymeric material is dipped in a silver nitrate aqueous solution to adhere silver to the modified layer and dye it, followed by observing the section by a transmission electron microscope (TEM) or a scanning auger electron (SAE) microscope.

That is, according to this method, a metal seed layer is subjected to film formation on a surface-modified polyimide film and then removed by wet etching, and the resulting sample is section-cut by a microtome. Its slice is dipped in a silver nitrate aqueous solution having a concentration of from about 10% to 20% within one hour to dye a modified layer, the section of which is then observed by TEM. Displacement deposition of silver on the metal seed layer component bound to the modified layer enables one to observe a distinct contrast by TEM, whereby the thickness of the modified layer can be quantitatively evaluated.

Samples were prepared under various conditions by drying a polyimide film in vacuo, treating it by plasma or corona discharge, etc. and subjecting a metal seed layer to film formation by sputtering. The relations of the thickness of the modified layer evaluated by the foregoing dyeing method with the initial adhesion, the heat resistance adhesion and the PCT adhesion were examined.

As a result, it has been found that by employing a structure in which a modified layer on the surface of a polyimide film has a thickness of not more than 200 Å, and preferably not less than 50 Å that a metal seed layer comprising nickel, chromium or an alloy thereof is formed thereon, followed by further forming a copper layer thereon by copper electroplating or copper electroless plating or a combination of the both, it is possible to obtain a two-layer copper polyimide substrate in which any of an initial adhesion, a heat resistant adhesion after standing in air at 150° C. for 168 hours, and a PCT adhesion after PCT test at 121° C. and at a humidity of 95% under 2 atmospheres for 100 hours are 400 N/m or more in a thickness of copper of 8 $\mu$m. Inversely, in the case where the thickness of the dyed layer (modified layer) exceeded 200 Å, though a high value of the initial adhesion was obtained, the heat resistant adhesion and the PCT adhesion are, remarkably lowered. And also in the case where the thickness of the dyed layer less than 50 Å, a value of the initial adhesion decreases less than 400 N/m.

Incidentally, when the copper thickness increases, each of the foregoing adhesions is liable to exhibit a higher value. In the invention, the measurement of the adhesions was carried out on a basis of the measurement in a thickness of copper of 8 $\mu$m as currently used.

Further, for carrying out the invention, it is preferred that the polyimide film to be used is one containing pyromelltic acid dianhydride (PMDA) and 4,4'-diaminodiphenyl ether (ODA) as major components, or one containing a component comprising containing pyromelltic acid dianhydride (PMDA) and 4,4'-diaminodiphenyl ether (ODA) and a component comprising biphenyltetracarboxylic acid dianhydride (BPDA) and 4,4'-diaminodiphenyl ether (ODA) as major components.

EXAMPLES

Next, the invention will be described in more detail with reference to the following Examples along with the accompanying drawings.

Example 1

Figure 2:
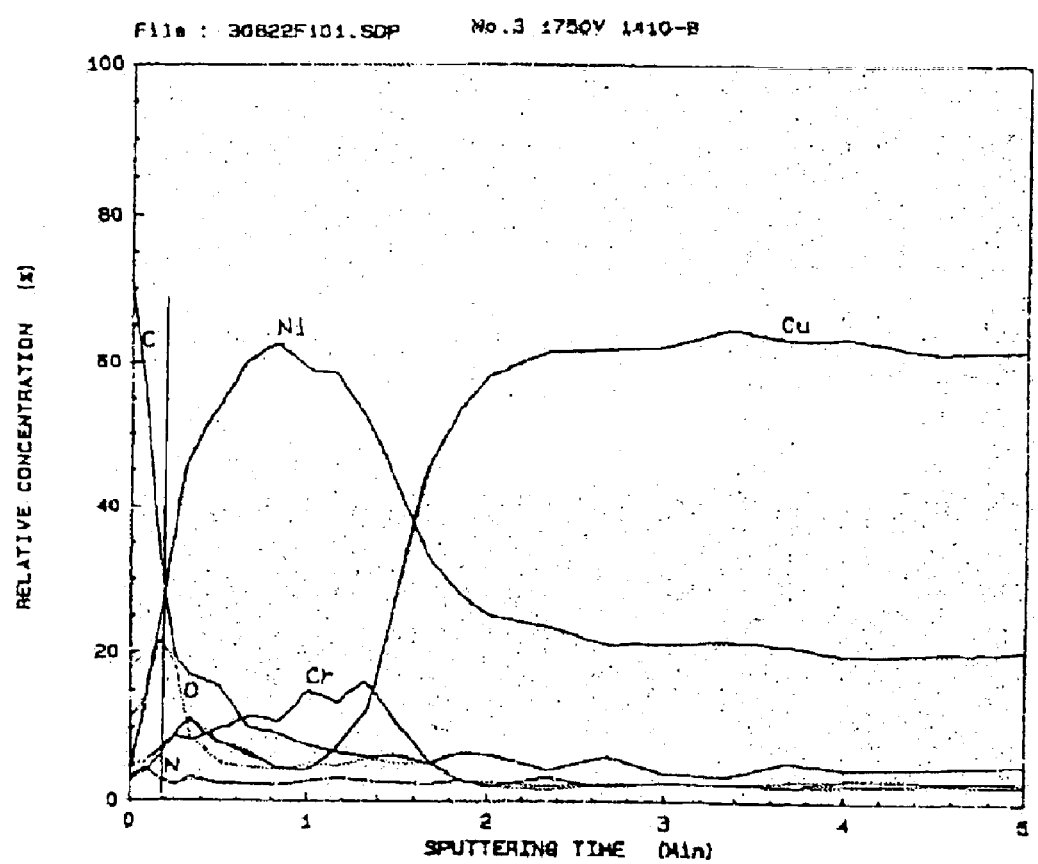
FIG. 2 shows the results of SAM analysis after heat test in the case of the modified layer thickness of 300 Å according to Example 1.

The surface of a polyimide film containing (PMDA+ODA) and (BPDA+ODA) as major components (Kapton 150EN, manufactured by Du Pont-Toray Co., Ltd.) was modified by plasma treatment, a metal seed layer made of a nickel-chromium alloy was formed thereon, and a copper layer of 8 $\mu$m was further formed thereon, to prepare samples. When a sample having a thickness of the modified layer of 300 Å was heat tested at 150° C. for 168 hours, the adhesion was lowered from 500 N/m to 180 N/m. The results of analysis of a peeled part of the specimen before and after the heat test in a depth direction by a scanning auger electron microscope (SAM) are shown in FIG. 1 (before the heat test) and FIG. 2 (after the heat test), respectively. In the drawings, the solid lines mean an interface between the polyimide film and the metal seed layer. Incidentally, the measurements of adhesions were all carried out according to JPCA BMO1-11.5.3.

Before the test, a high adhesion was obtained, and the peeled part was present inside the polyimide film as shown in FIG. 1. In contrast, after the test, the metal seed layer was oxidized and caused peeling at the interface between the polyimide film and the metal seed layer. It can be understood that this was caused by a phenomenon in which the metal seed layer was oxidized by oxygen contained in the modified-layer of the polyimide film and lost a chemical banding power to the polyimide film, whereby the adhesion was lowered.

Figure 3:
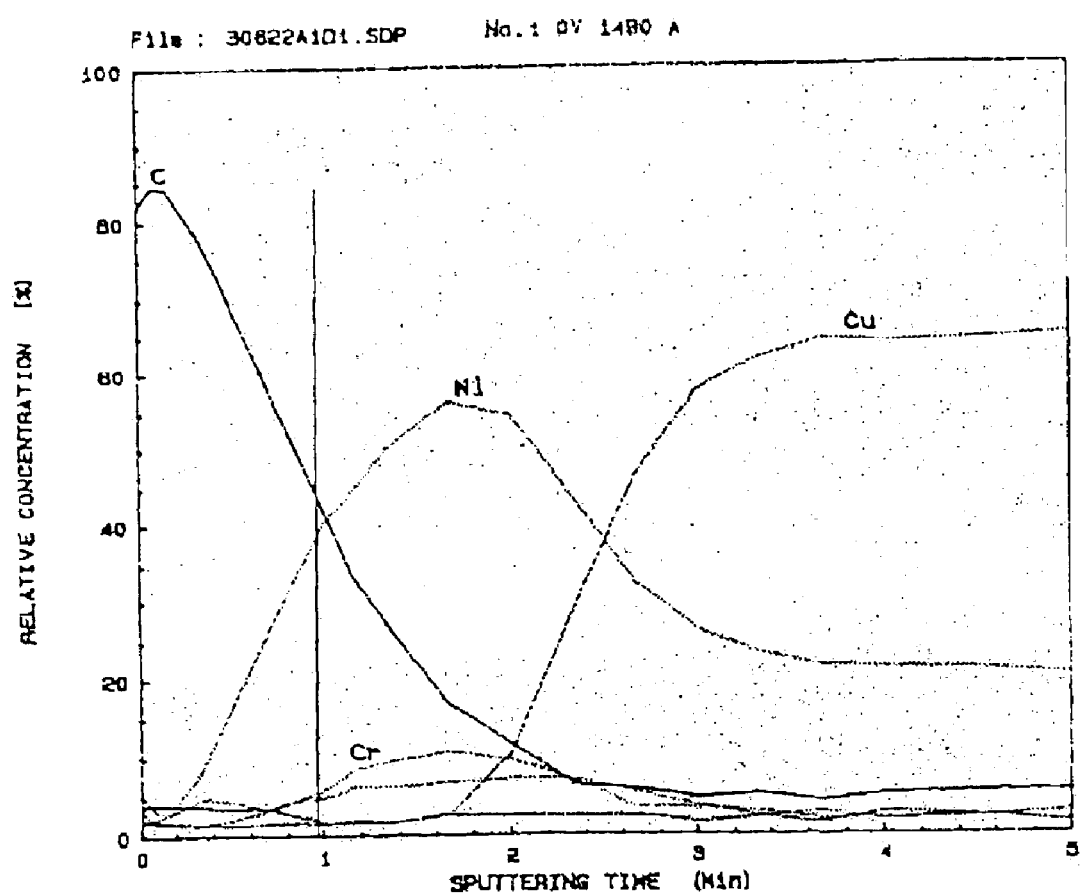
FIG. 3 shows the results of SAM analysis before heat test in the case of the modified layer thickness of 50 Å according to Example 1.
Figure 4:
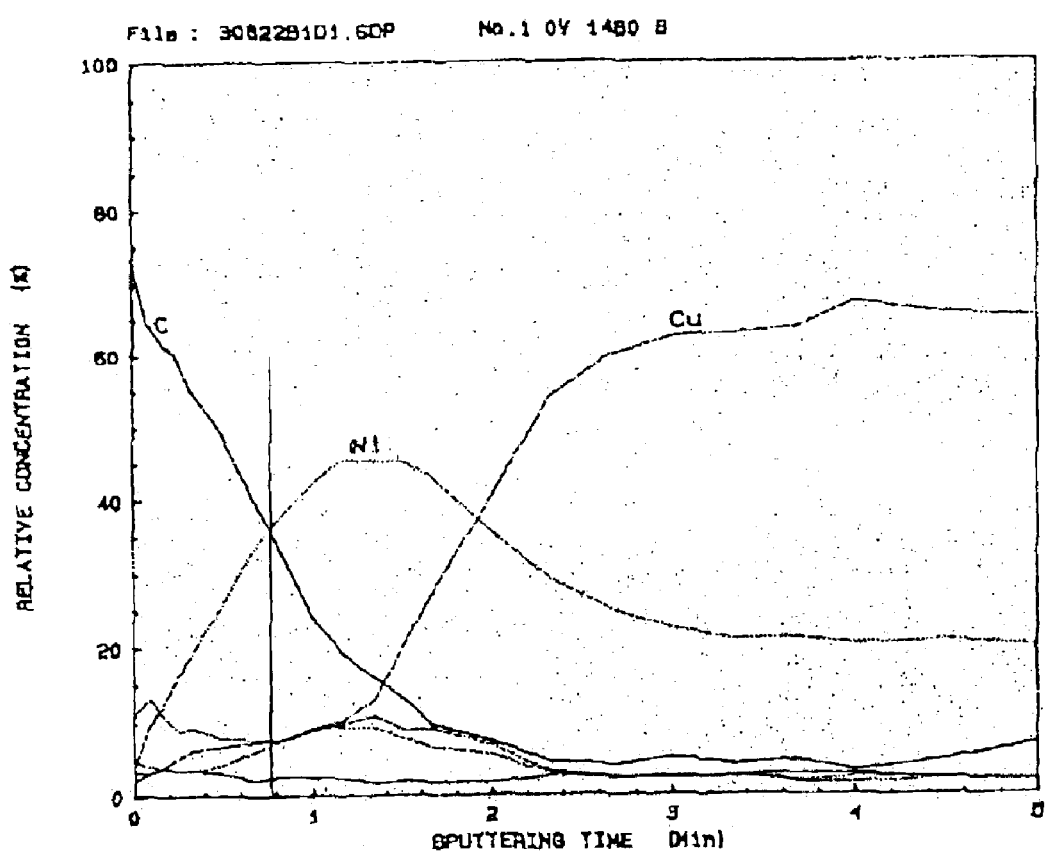
FIG. 4 shows the results of SAM analysis after heat test in the case of the modified layer thickness of 50 Å according to Example 1.

On the other hand, in a sample having a thickness of the modified layer of 50 Å, an adhesion as high as 450 N/m was obtained even after the heat test. The results of analysis of a peeled part of this specimen before and after the heat test in a depth direction by SAM are shown in FIG. 3 (before the heat test) and FIG. 4 (after the heat test), respectively. As shown in FIGS. 3 and 4, both before and after the heat test, the peeled part was present inside, and therefore, it is noted that when the modified layer is thin, oxidation of the metal seed layer is not found, whereby a high adhesion can be kept.

Example 2

Figure 5:
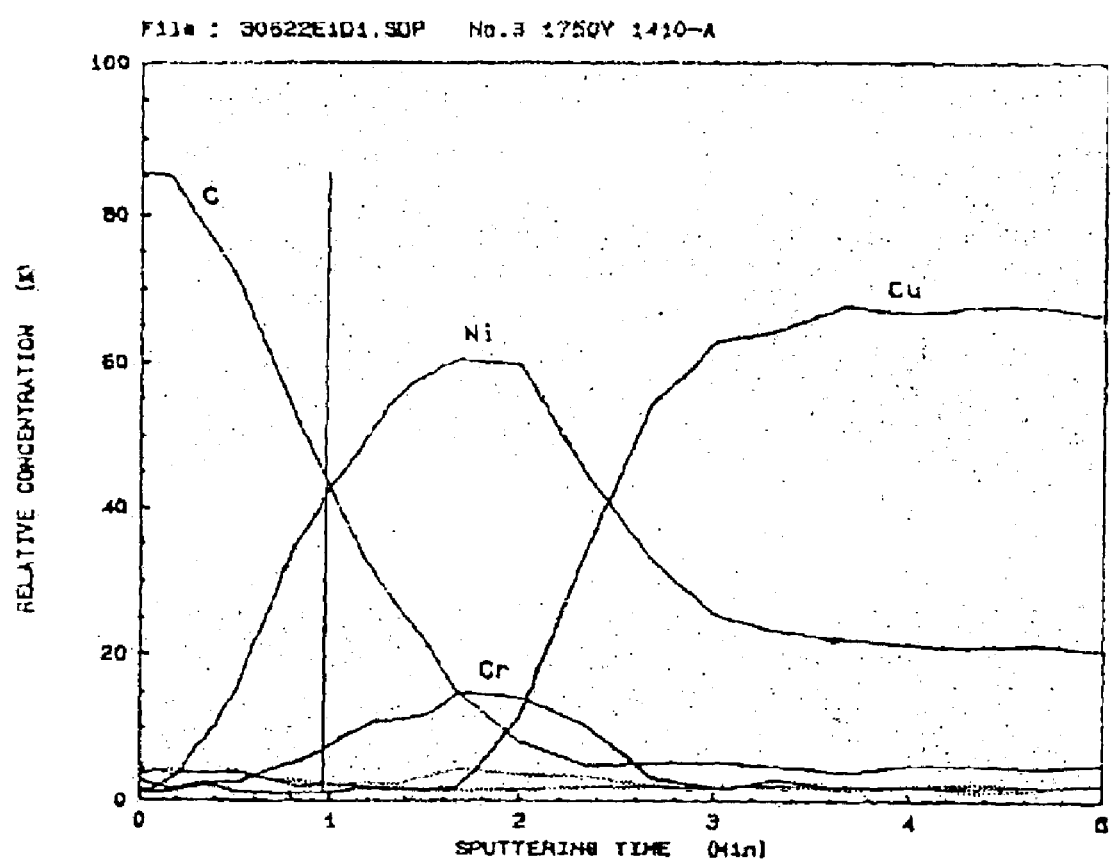
FIG. 5 shows the results of SAM analysis before PCT test in the case of the modified layer thickness of 300 Å according to Example 2.
Figure 6:
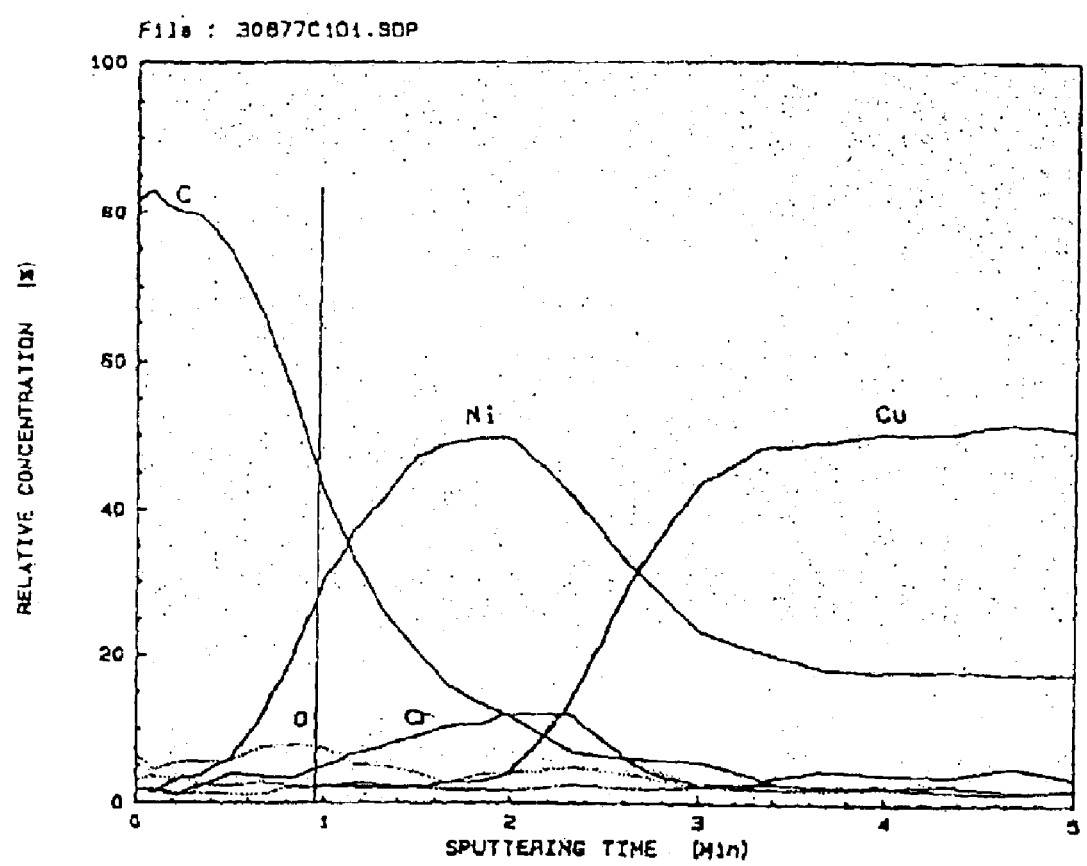
FIG. 6 shows the results of SAM analysis after PCT test in the case of the modified layer thickness of 300 Å according to Example 2.

The same samples as in Example 1 were prepared. When a sample having a thickness of the modified layer of 300 Å was subjected to PCT test at 121° C. and at a humidity of 95% under 2 atmospheres for 100 hours, the adhesion greatly; lowered from 500 N/m to 20 N/m. The results of analysis of a peeled part and metal seed layer side of the specimen before and after the PCT test in a depth direction by a scanning auger electron microscope (SAM) are shown in FIG. 5 (before the PCT test) and FIG. 6 (after the PCT test), respectively.

It is noted that both before and after the heat test, the polyimide film is adhered onto the metal seed layer and that the peeled part is present inside the polyimide film. It can be understood that in the PCT test, a reduction in the adhesion occurred due to brittleness of the polyimide film itself.

Figure 7:
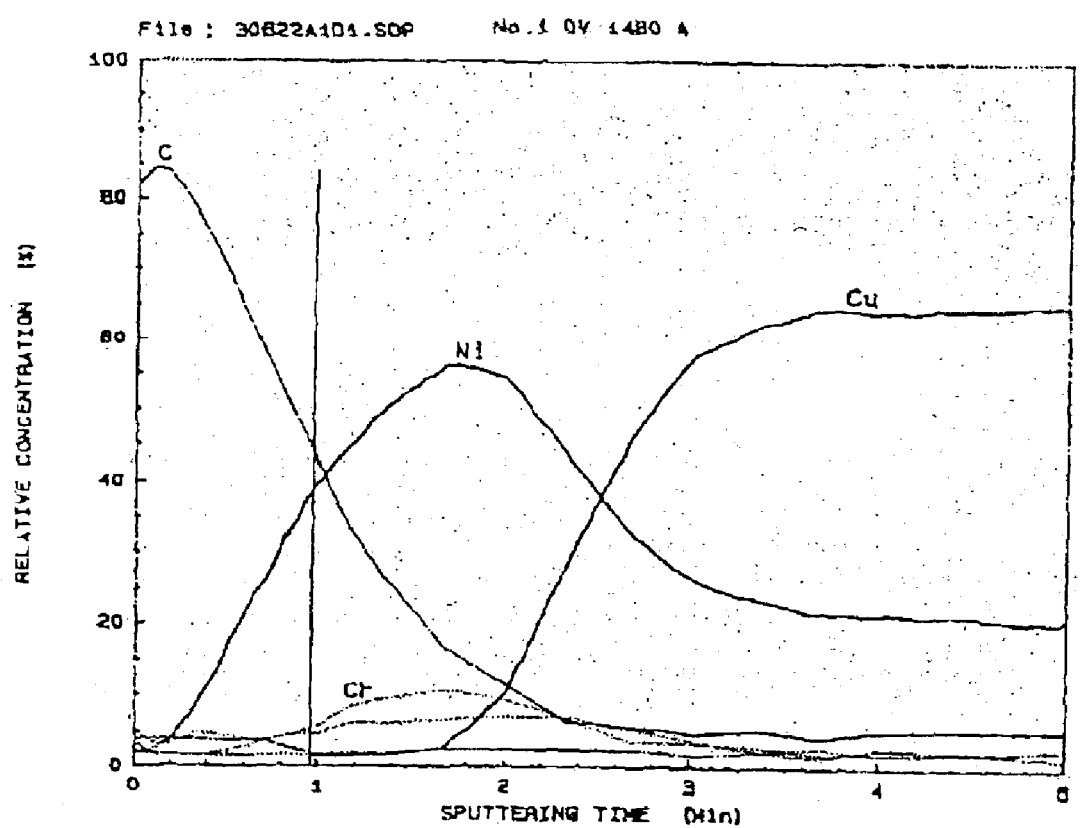
FIG. 7 shows the results of SAM analysis before PCT test in the case of the modified layer thickness of 50 Å according to Example 2.
Figure 8:
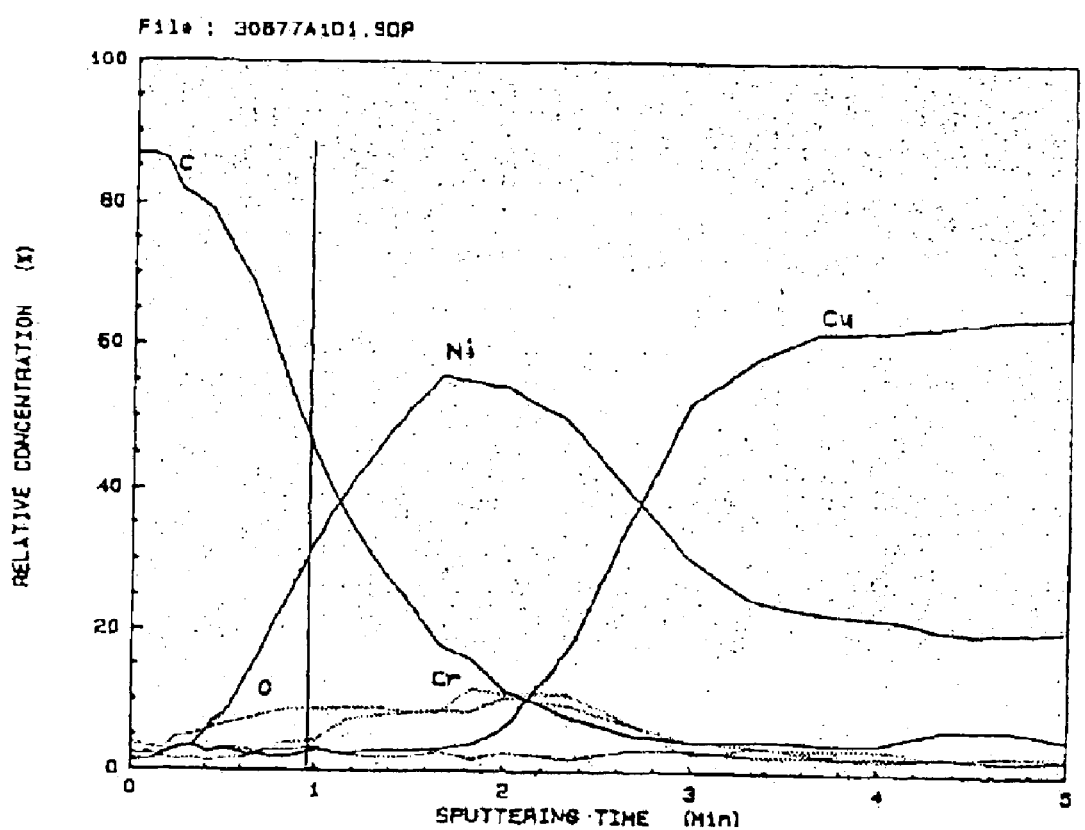
FIG. 8 shows the results of SAM analysis after PCT test in the case of the modified layer thickness of 50 Å according to Example 2.

On the other hand, in a sample having a thickness of the modified layer of 50 Å, an adhesion as high as 510 N/m was obtained even after the PCT test. The results of analysis of a peeled part of this specimen by SAM are shown in FIG. 7 (before the test) and FIG. 8 (after the test), respectively. In this case, the peeled part was present inside, too. However, when the modified layer was thin, brittleness of the polyimide film did not occur, whereby a high adhesion could be kept.

Example 3

As a polyimide film to be used, Kapton 100V (containing PMDA and ODA as major components, manufactured by Du Pont-Toray Co., Ltd.) and the foregoing Kapton 150EN were each dried in vacuo and subjected to plasma treatment or corona discharge, and further subjected to film formation with a metal seed layer by sputtering, to prepare samples under various conditions. The thickness of a modified layer of each sample was evaluated by a method of observing a section dyed with a silver nitrate aqueous solution by a transmission electron microscope (TEM).

Figure 9:
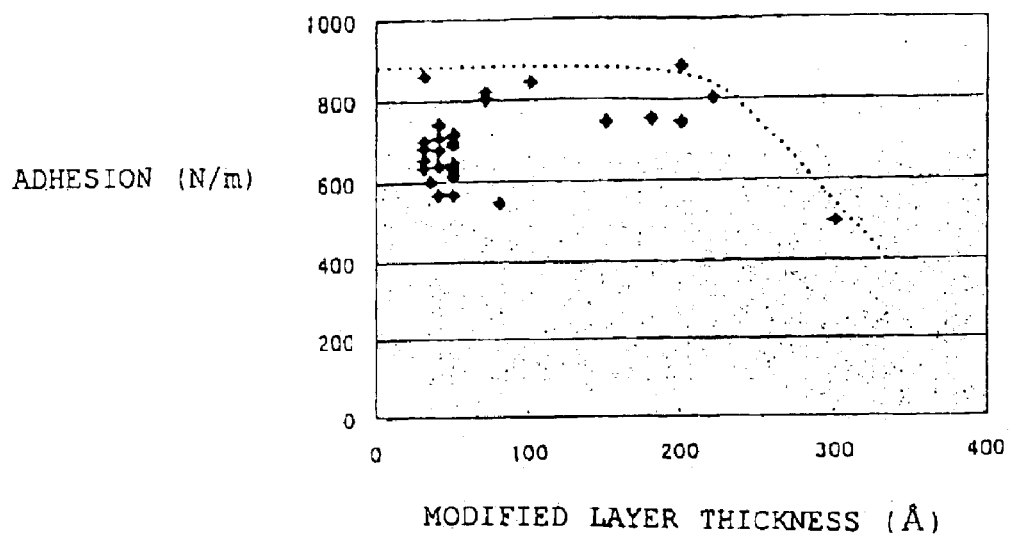
FIG. 9 shows the relation between the modified layer thickness and the initial adhesion according to Example 3.
Figure 10:
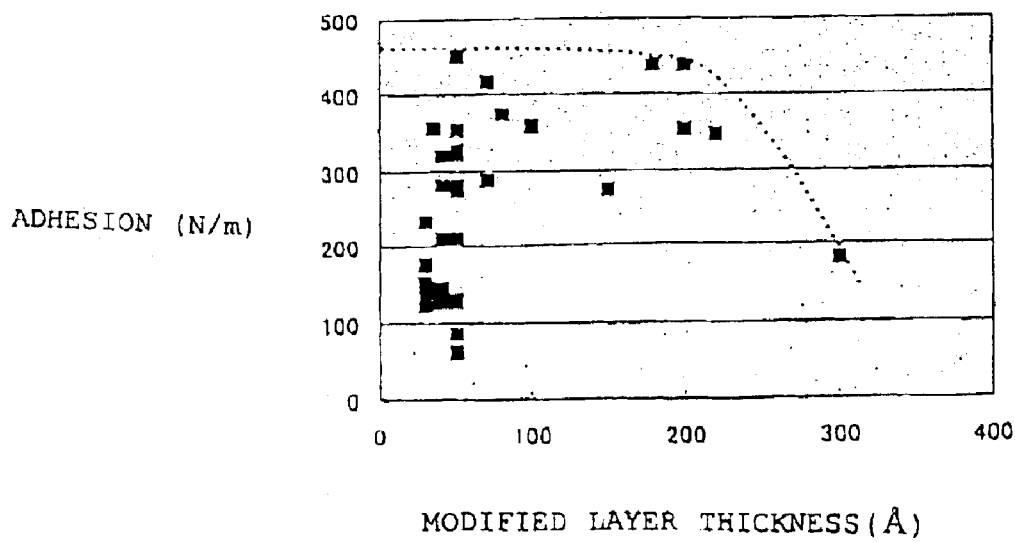
FIG. 10 shows the relation between the modified layer thickness and the heat resistant adhesion according to Example 3.
Figure 11:
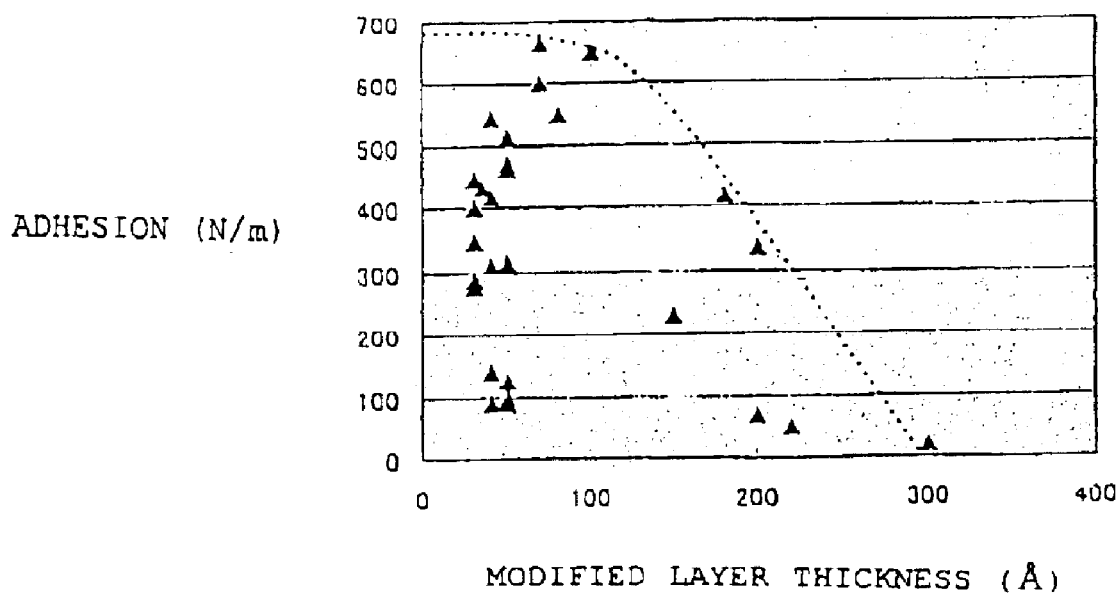
FIG. 11 shows the relation between the modified layer thickness and the PCT adhesion according to Example 3.

The results of examination of relations of the thickness of the modified layer with the initial adhesion, the heat resistance adhesion and the PCT adhesion are shown in FIGS. 9 to 11. In the drawings, each dotted line shows tendency of the maximum value of each of the adhesions, and it was noted that in order that the initial adhesion, the heat resistant adhesion and the PCT adhesion are 400 N/m or more simultaneously, the thickness of the modified layer is at least required to be not more than 200 Å.

With respect to the initial adhesion, the values of 400 N/m or more were obtained in all of the samples as examined. With respect to the heat resistant adhesion and the PCT adhesion, when the thickness of the modified layer exceeded 200 Å, there was no condition capable of meeting the values of 400 N/m or more.

However, when the thickness of the modified layer was not more than 200 Å, it was noted that by choosing the condition where the initial adhesion is high, a two-layer copper polyimide substrate capable of meeting all of the initial adhesion, heat resistant adhesion and PCT adhesion of 400 N/m can be obtained. For example, as shown in FIGS. 9 to 11, there were obtained two-layer copper substrates having an initial adhesion of 760 N/m, a heat resistant adhesion of 440 N/m and a PCT adhesion of 420 N/m in a thickness of modified layer of 180 Å, an initial adhesion of 820 N/m, a heat resistant adhesion of 420 N/m and a PCT adhesion of 600 N/m in a thickness of modified layer of 70 Å and an initial adhesion of 720 N/m, a heat resistant adhesion of 450 N/m and a PCT adhesion of 510 N/m in a thickness of modified layer of 50 Å, respectively.

This is because by controlling the thickness of the modified layer thin, oxidation of the metal seed layer and brittleness of the polyimide film at the interface could be suppressed.

As described above, the invention can ensure adhesion characteristics of two-layer copper polyimide substrates such that all of an initial adhesion, a heat resistant adhesion and a PCT adhesion are 400 N/m, an aspect of which has hitherto been considered difficult. Thus, according to the invention, it has become possible to obtain wiring materials for packaging parts (such as COF, TAB and CSP) with high density, high precision and high reliability.

What is claimed is:

1. A two-layer copper polyimide substrate comprising at least a polyimide film, a single metal seed layer formed directly on the polylmide film, and a copper layer consisting of copper formed on the metal seed layer, wherein the surface of the polyimide film contacted by the metal seed layer includes a polyimide modified layer having a thickness of not more than 200 Å as evaluated by the silver nitrate dyeing method, wherein the adhesion strength as evaluated by at least one of an initial adhesion, a heat resistant adhesion after standing in air at 150° C. for 168 hours, and a PCT adhesion after PCT test at 121° C. and at a humidity of 95% under 2 atmospheres for 100 hours is 400 N/m or more with a thickness of the copper layer of copper of 8 µm.

2. The two-layer copper polyimide substrate according to claim 1, wherein the metal seed layer consists of at least one metal selected from the group consisting of nickel, chromium, and an alloy thereof.

3. The two-layer copper polyimide substrate according to claim 1 or 2, wherein the polyimide film is one containing pyromelltic acid dianhydide (PMDA) and 4,4'-diaminodiphenyl ether (ODA) as major components, or one containing a component comprising containing pyromelltic acid dianhydride (PMDA) and 4,4'-diaminophenylether (ODA) and a component comprising biphenyltetracarboxylic acid dianhydride (BPDA) and 4,4'-diaminodiphenyl ether (ODA) as major components.

4. The two-layer copper polyimide substrate according to claim 1 or 2, wherein the polyimide modified layer has a thickness of not less than 50 Å as evaluated by the silver nitrate dyeing method.

5. The two-layer copper polyimide substrate according to claim 1 or claim 2, wherein the polyimide modified layer is produced by plasma treatment, corona discharge, or wet treatment of the polyimide film.

* * * * *

UNITED STATES PATENT AND TRADEMARK OFFICE
CERTIFICATE OF CORRECTION

PATENT NO. : 6,875,519 B2
DATED : April 5, 2005
INVENTOR(S) : Noriyuki Saeki et al.

It is certified that error appears in the above-identified patent and that said Letters Patent is hereby corrected as shown below:

Column 6,
Lines 8-9, replace with -- "dyeing method, wherein the adhesion strength as evaluated by any of an initial adhesion, a heat resistant" --.

Signed and Sealed this

Twenty-third Day of August, 2005

JON W. DUDAS
*Director of the United States Patent and Trademark Office*